United States Patent
Cha

(10) Patent No.: US 7,449,712 B2
(45) Date of Patent: Nov. 11, 2008

(54) CMOS IMAGE SENSOR AND METHOD FOR FABRICATING THE SAME

(75) Inventor: Han-Seob Cha, Chungcheongbuk-do (KR)

(73) Assignee: MagnaChip Semiconductor, Ltd. (KR)

( * ) Notice: Subject to any disclaimer, the term of this patent is extended or adjusted under 35 U.S.C. 154(b) by 112 days.

(21) Appl. No.: 11/474,410

(22) Filed: Jun. 26, 2006

(65) Prior Publication Data

US 2007/0001164 A1  Jan. 4, 2007

(30) Foreign Application Priority Data

Jun. 30, 2005 (KR) .................. 10-2005-0058459

(51) Int. Cl.
- H01L 29/06 (2006.01)
- H01L 31/072 (2006.01)
- H01L 31/109 (2006.01)
- H01L 31/0328 (2006.01)
- H01L 31/0336 (2006.01)

(52) U.S. Cl. ............... 257/19; 257/63; 257/69; 257/288; 257/E21.051; 257/E21.056; 257/E21.115; 257/E21.182; 257/E21.632

(58) Field of Classification Search .......... 257/19, 257/63, 69, 59, 79, 148, 192, 213, 288
See application file for complete search history.

(56) References Cited

U.S. PATENT DOCUMENTS

| | | | | |
|---|---|---|---|---|
| 5,179,430 A | * | 1/1993 | Torikai | 257/186 |
| 5,557,121 A | * | 9/1996 | Kozuka et al. | 257/292 |
| 6,943,051 B2 | * | 9/2005 | Augusto et al. | 438/58 |
| 2006/0157806 A1 | * | 7/2006 | Rhodes | 257/414 |

* cited by examiner

*Primary Examiner*—David Nhu
(74) *Attorney, Agent, or Firm*—Morgan Lewis & Bockius LLP

(57) ABSTRACT

A CMOS image sensor includes a substrate including silicon, a silicon germanium (SiGe) epitaxial layer formed over the substrate, the SiGe epitaxial layer formed through epitaxial growth and doped with a predetermined concentration level of impurities, an undoped silicon epitaxial layer formed over the SiGe epitaxial layer by epitaxial growth, and a photodiode region formed from a top surface of the undoped silicon epitaxial layer to a predetermined depth in the SiGe epitaxial layer.

10 Claims, 4 Drawing Sheets

CMOS IMAGE SENSOR AND METHOD FOR FABRICATING THE SAME

FIELD OF THE INVENTION

The present invention relates to an image sensor, and more particularly, to a complementary metal oxide semiconductor (CMOS) image sensor and a method for fabricating the same.

DESCRIPTION OF RELATED ARTS

Generally, an image sensor is a device that captures image information using a photo-reaction in a semiconductor material. The device transforms electrical values in pixels into a level capable of signalizing, each pixel detecting subjects with different brightness and wavelength. The image sensor generally includes a charge coupled device (CCD) image sensor and a complementary metal oxide semiconductor (CMOS) image sensor. The image sensor uses a photodiode as a photodetector, which absorbs light captured from an external subject image, and collects and accumulates photocharges.

A typical unit pixel of a CMOS image sensor includes a photodiode and four transistors. The four transistors are a transfer transistor, which transfers photocharges integrated in the photodiode to a floating diffusion region; a reset transistor, which sets an electric potential level of a node to a desired value and discharges electric charges to reset the floating diffusion region; a select transistor, which allows addressing by switching; and a drive transistor, which functions as a source follower buffer amplifier. The transfer transistor and the reset transistor utilize native transistors, and the drive transistor and the select transistor utilize normal transistors. The reset transistor is a transistor for correlated double sampling (CDS).

Such unit pixel of a CMOS image sensor uses the native transistor to detect light in a visible light wavelength band, and sends the detected photocharges to the floating diffusion region, i.e., a gate of the drive transistor, and then, outputs the photocharges sent to the floating diffusion region as electrical signals at an output terminal.

FIG. 1 is a cross-sectional view illustrating a typical CMOS image sensor. Herein, only a photodiode and a transfer transistor are illustrated. A P-type epitaxial layer 12 is formed on a $P^{++}$-type substrate 11. The P-type epitaxial layer 12 is doped with P-type impurities in-situ and is formed by an epitaxial growth process, and the $P^{++}$-type substrate 11 is highly doped with P-type impurities. A field oxide layer 13 is formed in a predetermined portion of the P-type epitaxial layer 12 for use in device isolation.

A gate oxide layer 14 is formed on a predetermined portion of the P-type epitaxial layer 12, and a gate electrode 15 of the transfer transistor is formed on the gate oxide layer 14. Spacers 16 are formed on both sidewalls of the gate oxide layer 14 and the gate electrode 15.

An N-type impurity region 17 having a predetermined depth is formed in the P-type epitaxial layer 12. The N-type impurity region 17 is formed to align with an edge of the corresponding spacer 16 formed on one sidewall of the gate electrode 15. A P-type impurity region 18 is formed to align with the corresponding spacer 16, and is formed between a top surface of the N-type impurity region 17 and a top surface of the P-type epitaxial layer 12. The N-type impurity region 17 is referred to as a deep $N^-$ region and the P-type impurity region 18 is referred to as a $P^0$ region.

According to the typical technology described with FIG. 1, electron hole pair (EHP) carriers are generated by lights near a PN junction region, which includes the N-type impurity region 17 and the P-type epitaxial layer 12, and the carriers moving to the transfer transistor by a bias generate an electric current. Thus, light energy is transformed into electric current. Consequently, the PN junction region including the N-type impurity region 17 and the P-type epitaxial layer 12 becomes the photodiode.

However, because the typical photodiode commonly uses silicon as a medium, an EHP generation rate decreases upon the impingement of light energy. The P-type epitaxial layer and the N-type impurity region both include a silicon material. Thus, a low electric current may be generated. Such characteristic results in a decreased resistance towards noise.

SUMMARY OF THE INVENTION

It is, therefore, an object of the present invention to provide a complementary metal oxide semiconductor (CMOS) image sensor having a high resistance toward noise by increasing an electron hole pair generation rate of a photodiode, and a method for fabricating the same.

In accordance with an aspect of the present invention, there is provided a CMOS image sensor, including: a substrate including silicon; a silicon germanium (SiGe) epitaxial layer formed over the substrate, the SiGe epitaxial layer formed through epitaxial growth and doped with a predetermined concentration level of impurities; an undoped silicon epitaxial layer formed over the SiGe epitaxial layer by epitaxial growth; and a photodiode region formed from a top surface of the undoped silicon epitaxial layer to a predetermined depth in the SiGe epitaxial layer.

In accordance with another aspect of the present invention, there is provided a method for fabricating a CMOS image sensor, including: forming a SiGe epitaxial layer over a substrate by employing an epitaxial growth process, the SiGe epitaxial layer doped with a predetermined concentration level of impurities; forming an undoped silicon epitaxial layer over the SiGe epitaxial layer by employing an epitaxial growth process; and forming a photodiode region from a top surface of the undoped silicon epitaxial layer to a predetermined depth in the SiGe epitaxial layer by employing an ion implanting process.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

A complementary metal oxide semiconductor (CMOS) image sensor and a method for fabricating the same in accordance with exemplary embodiments of the present invention will be described in detail with reference to the accompanying drawings.

Figure 1:
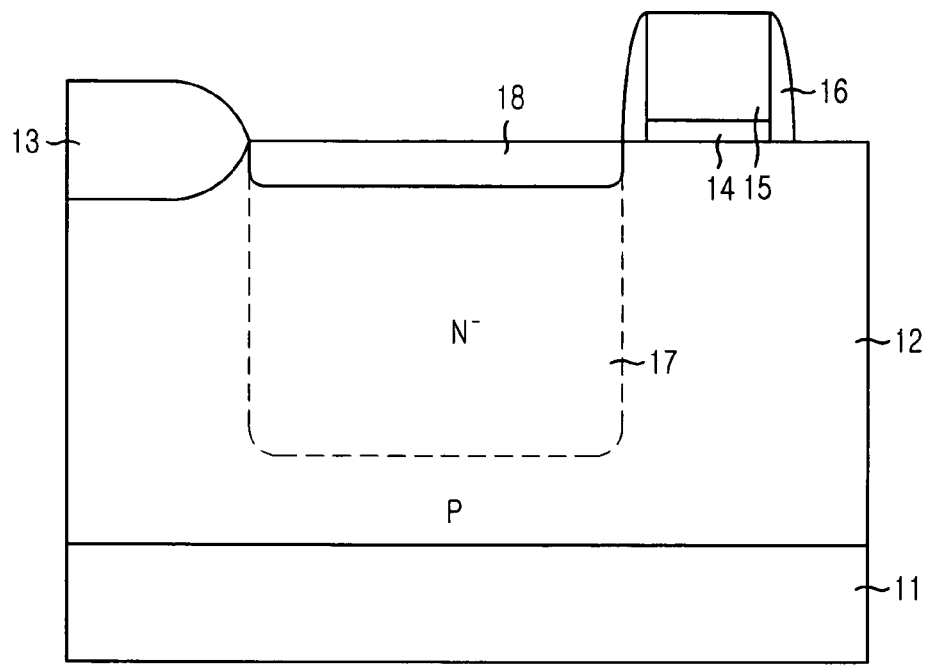
FIG. 1 is a cross-sectional view illustrating a typical complementary metal oxide semiconductor (CMOS) image sensor.
Figure 2:
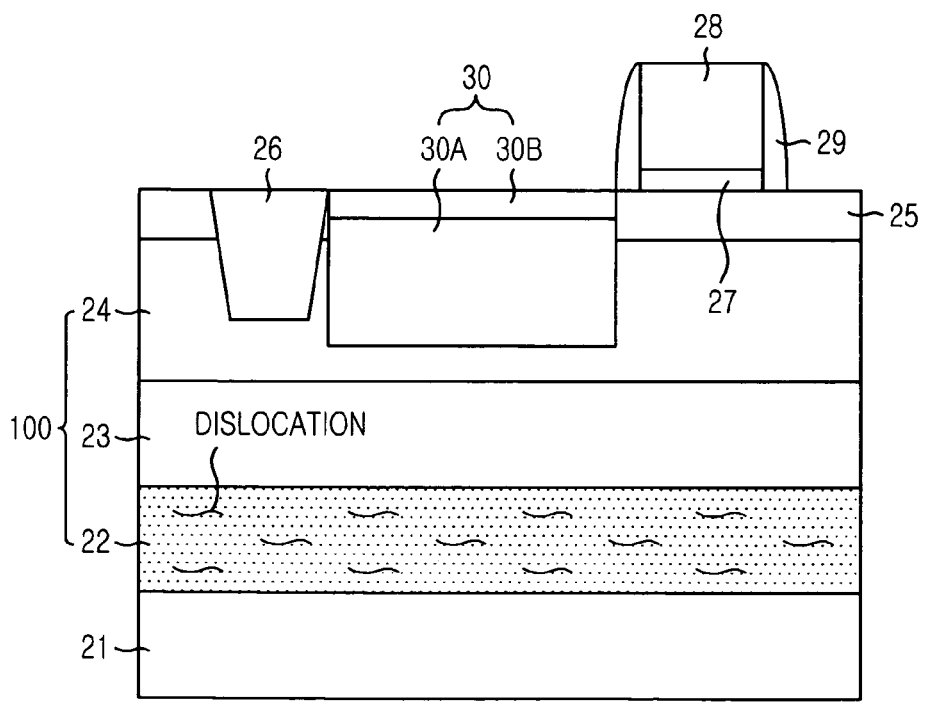
FIG. 2 is a cross-sectional view illustrating a CMOS image sensor in accordance with a specific embodiment of the present invention.

FIG. 2 is a cross-sectional view illustrating a CMOS image sensor in accordance with a specific embodiment of the present invention. A silicon germanium (SiGe) epitaxial layer 100 is formed over a substrate 21 including silicon. The SiGe epitaxial layer 100 is formed by an epitaxial growth process and is doped with a predetermined level of impurities, and the substrate 21 is doped with P-type impurities. An undoped silicon epitaxial layer 25 grown by employing an epitaxial growth process is formed over the SiGe epitaxial layer 100. A photodiode region 30 is formed from a top surface of the undoped silicon epitaxial layer 25 to a predetermined depth in the SiGe epitaxial layer 100. A gate pattern is formed over a predetermined portion of the undoped silicon epitaxial layer 25. The gate pattern includes a gate oxide layer 27, a gate electrode 28 and spacers 29. A field oxide layer 26 partially penetrating through the undoped silicon epitaxial layer 25 and the SiGe epitaxial layer 100 is formed adjacent to the photodiode region 30. Thus, the photodiode region 30 is formed between the field oxide layer 26 and the gate pattern.

More specifically, the SiGe epitaxial layer 100 includes: a first SiGe epitaxial layer 22 having a doping profile where a Ge concentration level is gradually increasing; a second SiGe epitaxial layer 23 grown over the first SiGe epitaxial layer 22 and highly doped with P-type impurities; a third SiGe epitaxial layer 24 grown over the second SiGe epitaxial layer 23 and lowly doped with P-type impurities.

The first SiGe epitaxial layer 22 of the SiGe epitaxial layer 100 includes dislocations generated by the gradually increasing Ge concentration level from approximately 0% to approximately 20%. A Ge concentration level of the second and third SiGe epitaxial layers 23 and 24 of the SiGe epitaxial layer 100 is maintained uniformly at approximately 20%.

The P-type impurities doped in the second and third SiGe epitaxial layers 23 and 24 include boron. A concentration level of boron doped in the second SiGe epitaxial layer 23 ranges from approximately $1 \times 10^{15}$ cm$^{-3}$ to approximately $1 \times 10^{18}$ cm$^{-3}$, and therefore, the second SiGe epitaxial layer 23 is a P$^{++}$ conductive type. A concentration level of boron doped in the third SiGe epitaxial layer 24 ranges from approximately $1 \times 10^{14}$ cm$^{-3}$ to approximately $1 \times 10^{17}$ cm$^{-3}$, and therefore, the third SiGe epitaxial layer 24 is a P$^-$ conductive type. Each of the first and second SiGe epitaxial layers 22 and 23 has a thickness ranging from approximately 1 µm to approximately 5 µm, and the third SiGe epitaxial layer 24 has a thickness ranging from approximately 3 µm to approximately 8 µm.

The substrate 21 is doped with P-type impurities. A concentration level of boron doped in the substrate 21 ranges from approximately $1 \times 10^{14}$ cm$^{-3}$ to approximately $1 \times 10^{17}$ cm$^{-3}$, and therefore, the substrate 21 is a P$^-$ conductive type. The undoped silicon epitaxial layer 25 is a channel region below the gate electrode 28. The photodiode region 30 includes a deep N$^-$-type impurity region 30A and a shallow P$^0$-type impurity region 30B. The photodiode region 30 is formed from a top surface of the undoped silicon epitaxial layer 25 to a predetermined depth in the third SiGe epitaxial layer 24.

Because the photodiode region 30 is formed in the SiGe epitaxial layer 100, such CMOS image sensor shown in FIG. 2 can secure higher quantum efficiency when compared with a photodiode formed in a silicon epitaxial layer. Thus, a higher number of EHPs can be generated with respect to the same amount of photons, resulting in a higher sensitivity.

A tensile stress is generated in the undoped silicon epitaxial layer 25. If a transistor is fabricated in this structure, mobility of electrons and holes increases, and thus, the speed of the device can be improved. Therefore, a high-speed device can be fabricated, and a noise characteristic can also be improved.

FIGS. 3A to 3F are cross-sectional views illustrating a method for fabricating a CMOS image sensor in accordance with the specific embodiment of the present invention.

Figure 3A:
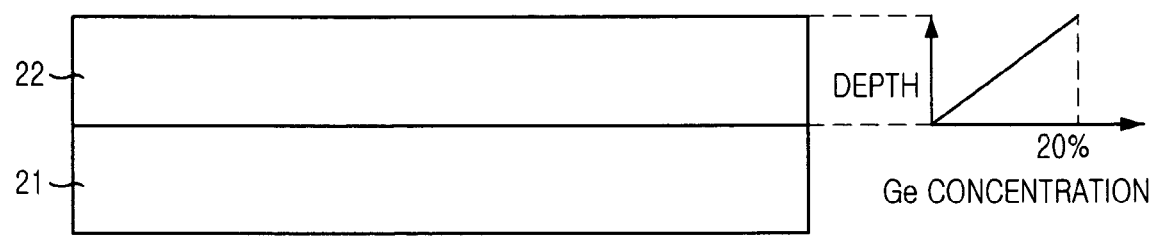
FIGS. 3A to 3F are cross-sectional views illustrating a method for fabricating a CMOS image sensor in accordance with the specific embodiment of the present invention.

Referring to FIG. 3A, the first SiGe epitaxial layer 22 is grown over the substrate 21 using an epitaxial growth process. The substrate 21 is lowly doped with P-type impurities, i.e., boron. The first SiGe epitaxial layer 22 employs germane (GeH$_4$) as a Ge source for doping Ge and is grown to a thickness ranging from approximately 1 µm to approximately 5 µm. A Ge concentration level in the first SiGe epitaxial layer 22 gradually increases from approximately 0% to approximately 20%. That is, at an initial stage of growth, the Ge concentration level in the first SiGe epitaxial layer 22 is approximately 0%, and as the growth proceeds, the Ge concentration level in the first SiGe epitaxial layer 22 gradually increases up to approximately 20%. Thus, the first SiGe epitaxial layer 22 has a doping profile where the Ge concentration level gradually increases during the epitaxial growth.

Meanwhile, the Ge concentration level in the first SiGe epitaxial layer 22 can gradually increase starting from approximately 10% instead of starting from the initial stage of growth. The Ge concentration level in the first SiGe epitaxial layer 22 can gradually increase up to approximately 50% maximum.

Figure 3B:
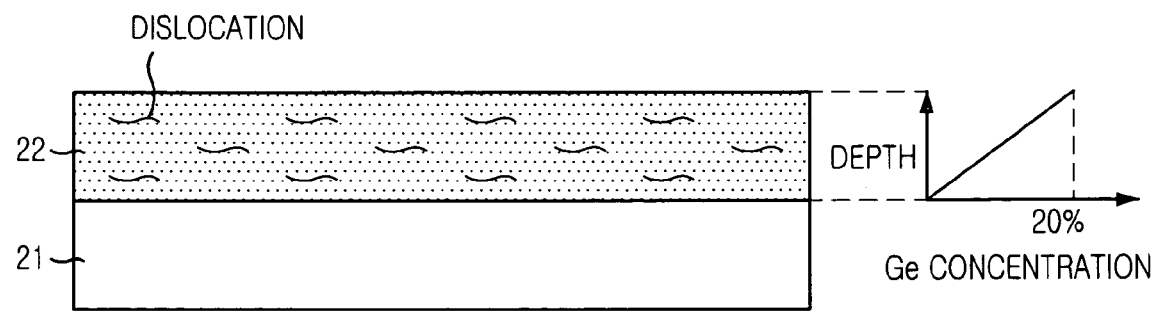

Referring to FIG. 3B, a furnace annealing process is performed after the first SiGe epitaxial layer 22 is grown. The furnace annealing process is performed in a nitrogen (N$_2$) atmosphere or a hydrogen (H$_2$) atmosphere at a temperature ranging from approximately 800° C. to approximately 1,100° C. By performing the furnace annealing process, dislocations are generated due to a stress generated by a large lattice constant of Ge. Ge has a larger lattice constant than Si, and thus, a stress is induced while growing Ge on Si through an epitaxial growth process. The higher the Ge concentration level and the higher the thickness of the first SiGe epitaxial layer 22, the stronger the stress becomes.

Figure 3C:
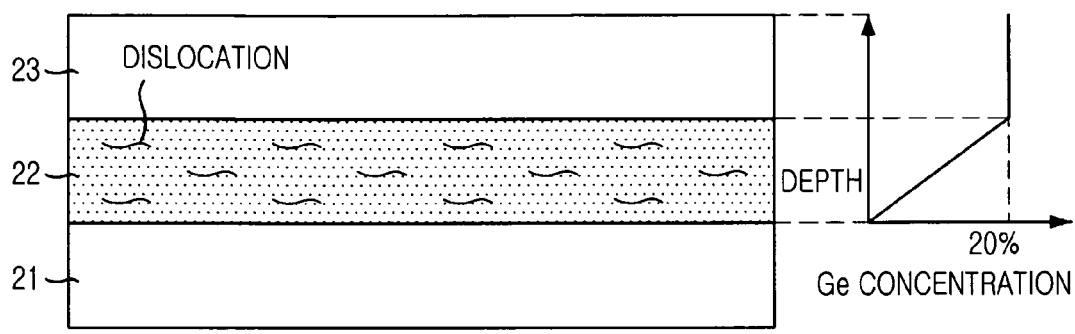

As shown in FIG. 3C, the dislocations are already formed while growing the first SiGe epitaxial layer 22 in a thickness ranging from approximately 1/a to approximately 5 µm. A sufficient amount of dislocations are formed when the furnace annealing process is performed at approximately 1,000° C. for approximately 1 hour. The stress generated in the first SiGe epitaxial layer 22 is released by the dislocations.

The second SiGe epitaxial layer 23 doped with boron in-situ is formed by employing an epitaxial growth process in a thickness ranging from approximately 1 µm to approximately 5 µm. A concentration level of boron in the second SiGe epitaxial layer 23 ranges from approximately $1 \times 10^{15}$ cm$^{-3}$ to approximately $1 \times 10^{18}$ cm$^{-3}$.

A Ge concentration level in the second SiGe epitaxial layer 23 is approximately 20%, identical to that of the first SiGe epitaxial layer 22, and the Ge concentration level is uniform over the entire region of the second SiGe epitaxial layer 23. The second SiGe epitaxial layer 23 employs GeH$_4$ as a Ge source for doping Ge and employs diborane (B$_2$H$_6$) as a boron source for doping boron. Since boron is doped in a high concentration level ranging from approximately $1 \times 10^{15}$ cm$^{-3}$ to approximately $1 \times 10^{18}$ cm$^{-3}$, the second SiGe epitaxial layer 23 is a P$^{++}$ conductive type.

Since the stress in the first SiGe epitaxial layer 22 is completely released and the normal lattice constant of SiGe is restored, it is almost stress-free during the growth of the second SiGe epitaxial layer 23. Therefore, the second SiGe epitaxial layer 23 can grow into a complete single crystal layer without dislocations even if the thickness is increased.

Figure 3D:
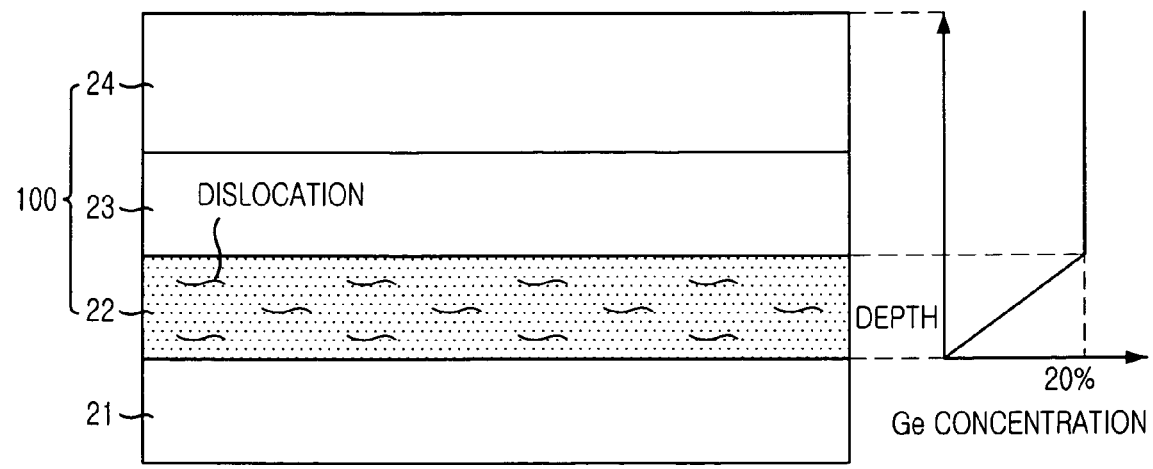

Referring to FIG. 3D, the third SiGe epitaxial layer 24 doped with boron is formed over the second SiGe eptiaxial layer 23 in a thickness ranging from approximately 3 μm to approximately 8 μm. A concentration level of boron in the third SiGe epitaxial layer 24 ranges from approximately $1 \times 10^{14}$ cm$^{-3}$ to approximately $1 \times 10^{17}$ cm$^{-3}$. The concentration level of boron in the third SiGe epitaxial layer 24 is about one order smaller than the concentration level of boron in the second SiGe epitaxial layer 23. A Ge concentration level in the third SiGe epitaxial layer 24 is approximately 20%, identical to that of the second SiGe epitaxial layer 23, and the Ge concentration level is uniform over the entire region of the third SiGe epitaxial layer 24. The third SiGe epitaxial layer 24 employs GeH$_4$ as a Ge source for doping Ge, and employs B$_2$H$_6$ as a boron source for doping boron. Since the third SiGe epitaxial layer 24 is doped with boron in a lower concentration level than the second SiGe epitaxial layer 23, the third SiGe epitaxial layer 24 is a P$^-$ conductive type. The concentration level of boron in the third SiGe epitaxial layer 24 ranges from approximately $1 \times 10^{14}$ cm$^{-3}$ to approximately $1 \times 10^{17}$ cm$^{-3}$. For reference, the substrate 21 doped with boron in a low concentration level ranging from approximately $1 \times 10^{14}$ cm$^{-3}$ to approximately $1 \times 10^{17}$ cm$^{-3}$ is a P$^-$ conductive type. Because the third SiGe epitaxial layer 24 is grown over the stress-free second SiGe epitaxial layer 23, the third SiGe epitaxial layer 24 also grows into a complete single crystal layer without dislocations.

Consistent with the present invention, the SiGe epitaxial layer 100 is formed as the epitaxial layer in which a photodiode is to be formed instead of a silicon epitaxial layer, the SiGe epitaxial layer 100 including the first SiGe epitaxial layer 22, the second SiGe epitaxial layer 23, and the third SiGe epitaxial layer 24.

The first SiGe epitaxial layer 22 has the doping profile where the Ge concentration level gradually increases from approximately 0% to approximately 20%. The second SiGe epitaxial layer 23 has the uniform Ge concentration level of approximately 20%, and is doped with the high concentration level of boron ranging from approximately $1 \times 10^{15}$ cm$^{-3}$ to approximately $1 \times 10^{18}$ cm$^{-3}$. The third SiGe epitaxial layer 24 has the uniform Ge concentration level of approximately 20%, and is doped with the low concentration level of boron ranging from approximately $1 \times 10^{14}$ cm$^{-3}$ to approximately $1 \times 10^{17}$ cm$^{-3}$.

Figure 3E:
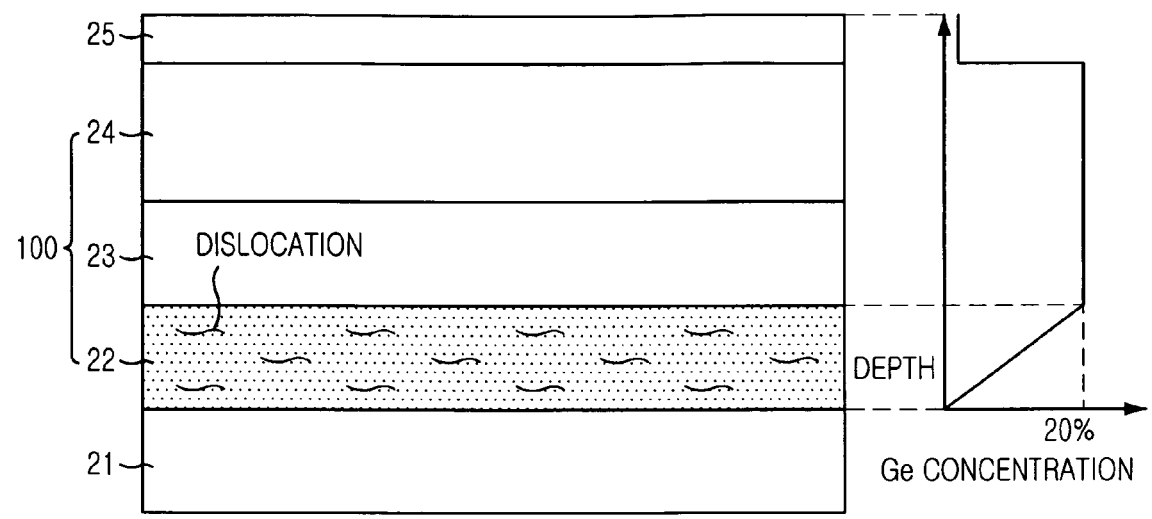

As shown in FIG. 3E, the undoped silicon epitaxial layer 25 is formed over the third SiGe epitaxial layer 24 using an epitaxial growth process to a thickness ranging from approximately 150 Å to approximately 500 Å. The undoped silicon epitaxial layer 25 is not doped with impurities. Herein, dichlorosilane (SiH$_2$Cl$_2$) or silane (SiH$_4$) is used as a silicon source for forming the undoped silicon epitaxial layer 25.

The undoped silicon epitaxial layer 25 is the region where a channel of four transistors constituting a unit pixel is to be formed. Since the third SiGe epitaxial layer 24 is formed underneath the undoped silicon epitaxial layer 25, a stress, especially a tensile stress, is generated in the undoped silicon epitaxial layer 25.

Figure 3F:
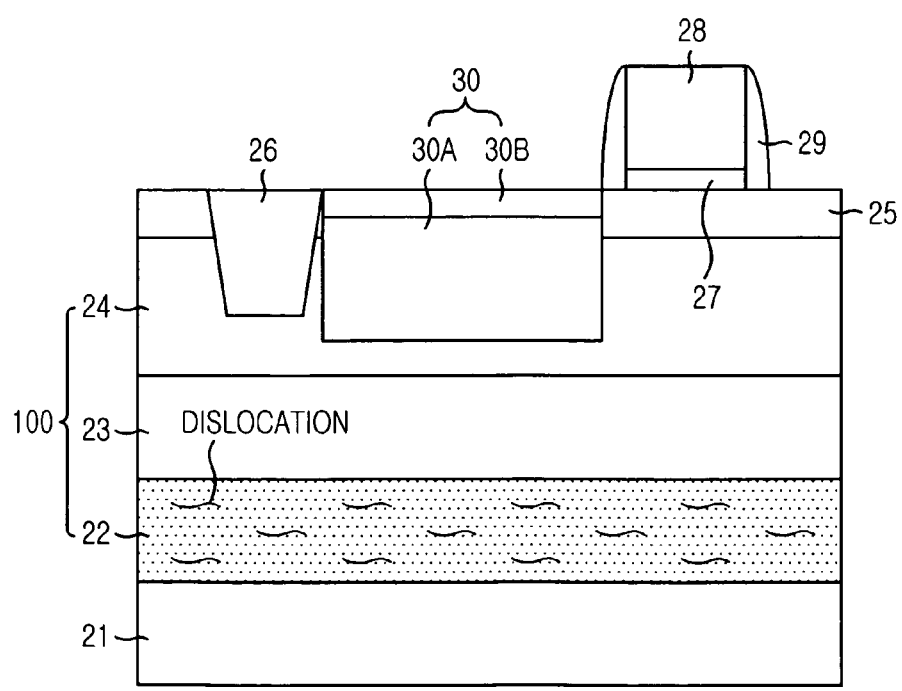

Referring to FIG. 3F, a predetermined portion of the undoped silicon epitaxial layer 25 and the third SiGe epitaxial layer 24 is etched to form a trench, and the field oxide layer 26 is filled into the trench. The gate oxide layer 27 is formed over a predetermined portion of the undoped silicon epitaxial layer 25, and the gate electrode 28 of the four transistors of the unit pixel is formed over the gate oxide layer 27. The gate electrode 28 is a gate electrode of a transfer transistor Tx.

The spacers 29 are formed on both sidewalls of the gate oxide layer 27 and the gate electrode 28. Herein, the spacers 29 are formed by forming a nitride layer and performing an etch-back process. At this time, the gate oxide layer 27, the gate electrode 28, and the spacers 29 constitute a gate pattern. A process for forming a photodiode region is performed.

That is, the photodiode region 30 is formed to extend from the top surface of the undoped silicon epitaxial layer 25 to a predetermined depth in the third SiGe epitaxial layer 24, and is aligned with the individual spacer 29 on one side of the gate pattern, i.e., between the field oxide layer 26 and the gate pattern. The photodiode 30 is divided into the deep N$^-$ type impurity region 30A and the shallow P$^0$ type impurity region 30B. Herein, the photodiode region 30 is formed from the top surface of the undoped silicon epitaxial layer 25 to the predetermined depth in the third SiGe epitaxial layer 24. By forming the N$^-$ type impurity region 30A, a PN junction region including the P-type epitaxial layers and the N$^-$ type impurity region 30A is formed. The PN junction region constitutes a photodiode.

In accordance with the specific embodiments of the present invention, the photodiode region is formed in the SiGe epitaxial layer to secure a high level of quantum efficiency, and thus, a higher number of EHPs can be formed toward one light quantum when compared to a silicon epitaxial layer, resulting in an improved sensitivity of the photodiode.

Furthermore, by fabricating transistors on the undoped silicon epitaxial layer which has a tensile stress and is formed over the SiGe epitaxial layer, the mobility of electrons and holes highly increases. Thus, high-speed devices can be fabricated and a noise characteristic can be improved.

Moreover, by using the SiGe epitaxial layer formed by employing an epitaxial growth process, that is, the single crystal layer of SiGe epitaxial layer, the photodiode can be formed free of defects. For reference, if a SiGe layer is formed through a simple deposition method instead of an epitaxial growth process, the layer obtains a polycrystalline characteristic instead of the single crystalline characteristic, and thus, a plurality of defects may be generated. Because the first to the third SiGe epitaxial layers are formed with different concentration levels, the SiGe epitaxial layers can be formed in a sufficient thickness and high doping concentration levels can be implemented. Furthermore, the high doping concentration level can improve light characteristics of wavelengths corresponding to a range of blue colors as well as wavelengths corresponding to a range of green colors.

The present application contains subject matter related to the Korean patent application No. KR 2005-58459, filed in the Korean Patent Office on Jun. 30, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:
1. A CMOS image sensor, comprising:
a substrate including silicon;
a silicon germanium (SiGe) epitaxial layer formed over the substrate, the SiGe epitaxial layer formed through epitaxial growth and doped with a predetermined concentration level of impurities, wherein the SiGe epitaxial layer includes layers which have different germanium (Ge) concentration gradients;
an undoped silicon epitaxial layer formed over the SiGe epitaxial layer by epitaxial growth; and a photodiode region formed from a top surface of the undoped silicon epitaxial layer to a predetermined depth in the SiGe epitaxial layer.

2. The CMOS image sensor of claim 1, wherein the SiGe epitaxial layer comprises:
a first SiGe epitaxial layer having a doping profile where a Ge concentration gradually increases from a bottom toward a top in the first SiGe epitaxial layer;
a second SiGe epitaxial layer highly doped with P-type impurities and formed over the first SiGe epitaxial layer; and
a third SiGe epitaxial layer lowly doped with P-type impurities and formed over the second SiGe epitaxial layer, wherein the second and the third SiGe epitaxial layers have a given Ge concentration level.

3. The CMOS image sensor of claim 2, wherein the Ge concentration level gradually increases in the first SiGe epitaxial layer from approximately 0% to approximately 20%, and the given Ge concentration level in the second and third SiGe epitaxial layers is maintained uniformly at approximately 20%.

4. The CMOS image sensor of claim 2, wherein the P-type impurities doped in the second and third SiGe epitaxial layers include boron.

5. The CMOS image sensor of claim 4, wherein a concentration level of boron doped in the second SiGe epitaxial layer ranges from approximately $1\times10^{15}$ cm$^{-3}$ to approximately $1\times10^{18}$ cm$^{-3}$.

6. The CMOS image sensor of claim 4, wherein a concentration level of boron doped in the third SiGe epitaxial layer ranges from approximately $1\times10^{14}$ cm$^{-3}$ to approximately $1\times10^{7}$ cm$^{-3}$.

7. The CMOS image sensor of claim 2, wherein each of the first and second SiGe epitaxial layers has a thickness ranging from approximately 1 μm to approximately 5 μm, and the third SiGe epitaxial layer has a thickness ranging from approximately 3 μm to approximately 8 μm.

8. The CMOS image sensor of claim 1, wherein the substrate is doped with P-type impurities.

9. The CMOS image sensor of claim 8, wherein the substrate is doped with boron.

10. The CMOS image sensor of claim 9, wherein a concentration level of boron doped in the substrate ranges from approximately $1\times10^{14}$ cm$^{-3}$ to approximately $1\times10^{17}$ cm$^{-3}$.

* * * * *